(12) United States Patent
Gschwind

(10) Patent No.: US 8,030,649 B2
(45) Date of Patent: Oct. 4, 2011

(54) SCAN TESTING IN SINGLE-CHIP MULTICORE SYSTEMS

(75) Inventor: Michael K. Gschwind, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 714 days.

(21) Appl. No.: 11/460,751

(22) Filed: Jul. 28, 2006

(65) Prior Publication Data

US 2008/0023700 A1    Jan. 31, 2008

(51) Int. Cl.
*H01L 29/04* (2006.01)
*H01L 29/10* (2006.01)
(52) U.S. Cl. ....... 257/48; 324/762.1; 365/201; 714/723; 714/733; 714/30
(58) Field of Classification Search .................. 257/48; 714/723, 733, 30; 324/158.1, 762.1; 365/201
See application file for complete search history.

(56) References Cited

U.S. PATENT DOCUMENTS 6,055,655 A * 4/2000 Momohara .................. 714/723
2008/0023700 A1* 1/2008 Gschwind ...................... 257/48
* cited by examiner

*Primary Examiner* — Michael Shingleton
(74) *Attorney, Agent, or Firm* — Ido Tuchman; William J. Stock

(57) ABSTRACT

Various techniques for testing multicore processors in an integrated circuit. Each core includes a plurality of registers configured to form at least two scan chains. In one embodiment, a verification unit located in the integrated circuit is electrically coupled to outputs of the scan chains. The verification unit is configured to determine the validity of the outputs of the scan chains and to indicate a malfunction of the integrated circuit if the outputs are determined not to be valid.

20 Claims, 4 Drawing Sheets

SCAN TESTING IN SINGLE-CHIP MULTICORE SYSTEMS

BACKGROUND OF THE INVENTION

The present invention relates generally to microelectronic hardware product testing. More specifically, the present invention relates to techniques for testing multi-core integrated circuits.

Modern microprocessor systems derive significant performance enhancements from the implementation of multiple, identical cores on a single integrated circuit (IC). Designing such multi-core integrated circuits generally begins with the design of a single core. Then, several identical, or nearly identical, replications of the core may be fabricated on a single die. For example, a multi-core processor chip may contain a core that is replicated multiple times, wherein each replicated core serves as a single processor. Additional circuitry may be added to the multi-core IC to couple the replicated cores together. Resources shared by the replicated cores may also be included in the IC. Such resources may include memory accessible to all cores and/or a controller configured to coordinate operations among the replicated cores. It is noted that a multi-core integrated circuit, as the term is used herein, includes any IC having a circuit design repeated at least twice.

Multi-core design offers numerous advantages compared to other techniques known in the art for improving the performance of ICs. Generally, when circuits are repeated several times using multi-core principles, performance is increased. Specifically, multi-core ICs may exploit CMOS device scaling to increase device density per unit of area. The resulting parallel operation of an increased number of CMOS devices advantageously increases performance. Furthermore, chip shrink factor and clock frequency limitations are becoming increasingly important considerations in IC design. Multi-core design practices are an effective response to these considerations. Other benefits offered by multi-core design include lower design cost and improved power consumption.

Historically, the most common strategy for improving the performance of a microprocessor has been to increase its clock speed. Most microprocessors include an internal clock that pulses at a well-defined frequency. The frequency is generally expressed in megahertz (MHz) or gigahertz (GHz). For example, a microprocessor with a clock speed of 1 GHz pulses 1,000,000,000 ($10^9$) times per second. The clock pulses may drive the operation of the microprocessor and may synchronize the various units of logic within the microprocessor with each other. A primitive operation performed by a microprocessor generally requires a specific number of clock cycles to be completed. Thus, the number of operations that can be performed per second increases in direct proportion to the increase in the clock speed.

Unfortunately, in the present state of the art, there are diminishing returns to increasing the frequency of the internal clock. Inherent physical limitations may interfere with increasing the micro-architectural frequency. An example of an inherent physical limitation is non-scaling, or even reverse scaling, of wire delay. In some cases, overcoming such limitations may be possible but may involve significant costs, such as research and development expenses and more expensive materials. In other cases, the limitations may be theoretical constraints that are impossible to overcome within the context of integrated circuit design paradigms known in the art. Therefore, including multiple cores within the same microprocessor may improve performance more effectively and/or at a lower cost per microprocessor than increasing clock speed.

Additionally, using multiple cores may result in lower design costs than would be required by other methods of improving performance. As more transistors are utilized in an integrated circuit, more time is generally required for circuit design, resulting in increased development cost. Multi-core design helps address such costs. In a multi-core design approach, a single core is typically designed and then replicated on a die. Because the core thus designed has fewer transistors than the entire integrated circuit, design costs may be reduced. While there are design costs associated with ensuring correct interaction of the replicated cores, the net design cost is still generally reduced through the application of multi-core design practices.

Moreover, multi-core designs may allow chip manufacturers to fabricate products with improved power consumption characteristics. Performance derived from parallel execution is generally more power efficient than performance derived from increased clock frequency. Thus, multiplying the number of cores in an IC by a given factor may provide similar performance but less power consumption compared to multiplying the clock frequency of the IC by the same factor. Decreasing power consumption is beneficial because in many environments, the cost of the power required to operate a system represents a significant proportion of the system's total operating cost. Furthermore, many systems operate in environments offering a limited power supply. For example, portable computers typically include a battery to allow operation when no electrical outlet is available. If the battery is out of power and no electrical outlets are available, the computer must cease operation.

Whether or not an integrated circuit has multiple cores, an integrated circuit design generally must be tested to ensure computer simulations of circuit designs function as expected in the real world. Thus, during the design of the integrated circuit, testing is performed to ensure that the integrated circuit works as anticipated. Later, once the design has been finalized and the integrated circuit is manufactured, each die produced must generally be tested to ensure that it operates correctly. IC testing is necessary during the manufacturing process because IC fabrication is a complex and precise process susceptible to minute contaminates and variations that can cause the integrated circuit not to function properly.

Testing, during both design and production, may include functional testing. In functional testing, input values are provided to the integrated circuit. The IC then performs one or more operations using the input values. The results are then analyzed to ensure their validity.

Functional testing of integrated circuits may be facilitated by design techniques known in the art as Design For Test (DFT), also known as Design For Testability. DFT techniques may include adding circuitry to an integrated circuit, wherein the primary purpose of the circuitry is to facilitate testing of the IC. DFT techniques often facilitate reading and writing the internal state of the IC more directly than is possible during normal operation. It is noted that such circuitry generally has no harmful effects during functional operation. The circuitry can thus be incorporated into the IC even though an end user will never use its capabilities.

One DFT technique known in the art is scan design. In scan design, a circuit under test (CUT) is initialized with test patterns using inputs on the IC housing the CUT. The CUT then performs one or more operations using the loaded test patterns. These operations are known in the art as "capture cycle(s)". The contents of each register in the CUT resulting from these operations may be observed directly via outputs on the IC. If there is some divergence between the output and an expected result, a problem in the CUT likely exists. If the output matches the expected result, there is more confidence that the CUT is functioning properly.

In scan design, one or more scan chains are used to input test patterns and to output the results of the capture cycles. A scan chain connects registers within the CUT into one long shift register. Registers within the CUT may include flip-flops, latches and any other technological device capable of storing data. A shift register can be conceptualized as a bucket brigade where at each pulse of a clock, every bucket (test pattern datum) in the bucket brigade is shifted one increment in the same direction. Thus, when a special test signal called "scan enable" is activated, test patterns may be shifted into the registers. Upon each pulse of a clock, a new datum is shifted from an input pin into the first register in the scan chain, and each datum already in the scan chain is shifted forward to the next register. It is noted that the clock driving the scan chain need not be the same as the functional clock used during normal operation of the IC. In fact, the scan chain clock may pulse at a lower frequency than the general IC clock due to considerations such as power dissipation and the quality of the wiring used to assemble the scan chains.

Once all data are loaded into the scan chain, scan enable mode may be deactivated, causing the CUT to resume normal operation. Thus, functional clock signals may be pulsed one or more times to cause the CUT to perform one or more operations. To view the results of these operations (the capture cycles), scan enable mode may be reactivated. Then, upon each pulse of a clock, the last datum in the scan chain is shifted to an output pin, and every other datum shifts forward to the next register. This allows the contents of each shift register to be viewed directly and compared to an expected result.

Scan testing of complex integrated circuits is expensive due to the number of scan steps that must be performed to test an increasing number of registers. When using scan design methods, one clock cycle is required for each register in a scan chain. For example, if a scan chain includes 100,000 latches, then 100,000 clock cycles are required to pass test data onto the scan chain. For reasons previously noted, the clock cycles used by the scan chains may be significantly longer than the functional clock cycles, further increasing the time required. It directly follows that the amount of time required to test an IC is proportional to the number of registers to be tested. This is important because the cost of testing an IC is proportional to the amount of time required for testing. Systems known in the art for testing ICs typically have a high cost; the cost can be divided by the system's anticipated lifespan to determine an estimated cost per unit of time. Additional costs of testing, such as power consumption, may also be approximately proportional to the amount of time required.

It follows that the cost to test multi-core integrated circuits using scan design methods is proportional to the number of replications of the core within the IC. For example, an IC with four instances of a core may cost approximately four times as much to test as an IC with only one instance of the same core. Clearly, this increased cost is disadvantageous. It may become even more disadvantageous in the future, as present trends are for ICs to include an increasing number of replications of a core.

Techniques known in the art for avoiding such increased costs in testing multi-core integrated circuits have significant drawbacks. One such technique is to utilize multiple, shorter scan chains in lieu of one, longer scan chain. A scan chain with 100,000 latches, for example, can be divided into 100 scan chains containing 1,000 latches each. In particular, a separate scan chain may be assembled for each core. The chief advantage of this approach is reducing the time required to perform a scan test by shifting in multiple values at the same time. As a result, the time required for testing is divided by a factor approximately equal to the number of scan chains (assuming the scan chains are of equal length.)

Unfortunately, this approach has several disadvantages. First, the number of scan chains supported by systems for testing is often limited. Increasing the number of supported scan chains increases testing system cost. Second, the number of pins required for input and output is proportional to the number of scan chains. Adding pins to an IC clearly increases manufacturing costs. Even if the increased costs are acceptable, the number of pins available on high capacity ICs is subject to physical and electrical limitations. As a result, this approach can be unfeasible as a long-term solution, since the number of available pins is growing less rapidly than the number of cores.

It is noted that while techniques exist in the art to multiplex input and output pins of a scan chain onto a single pin (which may also be used for other purposes), such techniques are of limited utility in avoiding the IO pin bottleneck. This is due to the inherent limitation that at a specific moment in time, a pin may only be providing data to a single scan chain. For example, an IC with 30 pins cannot simultaneously provide inputs to 32 scan chains, even if the input for each scan chain is multiplexed over pins used during functional operation for another purpose. Furthermore, increased integration reduces the number of design signal pins that can be easily shared for routing scan test data. This is often due to the adoption of new signaling mechanisms, such as differential signaling, which interfere with the sharing of pins between design, functional and test structures.

Another apparent workaround would be to increase the speed at which data may be entered into the scan chains. However, input speeds are limited by power dissipation considerations. Additionally, it may be cost-ineffective to utilize internal wiring of a sufficient quality to allow for rapid data transfer when that wiring will generally never be used again once the IC has been tested. Thus, it may be infeasible to increase the data rate for the scan chains.

Another workaround involves compressing the input data used to initialize the scan chains. One compression technique is to store the test pattern to be scanned into the registers on the IC. This approach is disadvantageous because it clearly increases manufacturing costs. Another compression technique involves compressing the data loaded into the scan chains and expanding it within the IC. This approach is limited in effectiveness because the proportion by which data may be compressed is subject to theoretical limits.

Those skilled in the art may wonder why Array Built-In Self Test (ABIST) cannot be used to test multi-core integrated circuits. ABIST is specialized for testing replicated arrays of circuits used for storage. It is generally unsuitable for testing logic such as that incorporated into microprocessors and other integrated circuits.

In summary, multi-core design of integrated circuits is highly advantageous, but its advantages can be counteracted by limitations in testing methods known in the art.

BRIEF SUMMARY OF THE INVENTION

The present invention addresses the above-mentioned limitations of the prior art by introducing techniques for testing multi-core integrated circuits. The invention beneficially allows each core of a multi-core integrated circuit to be tested while minimizing the cost and time required to load test pattern data and to process test results.

Thus, one exemplary aspect of the present invention is a method for testing a multi-core integrated circuit. The method includes an integrated circuit containing multiple replicated cores, wherein each core includes a plurality of registers. The registers are configured to form at least two scan chains. An input coupling operation couples inputs of the scan chains together such that the inputs of the scan chains are electrically connected in parallel circuit. An output coupling operation couples outputs of the scan chains to a verification unit. As a result of the input coupling, test pattern data may be provided to the scan chains of each core simultaneously. To test the integrated circuit, at least one computational operation may be performed on the test pattern data in the scan chains. A processing operation processes the outputs of the scan chains (which may now contain the results of the at least one computational operation) at the verification unit. The processing operation may include comparing the outputs of the scan chains to a reference signal configured to indicate an expected output. The processing operation may also include comparing the outputs of the scan chains to each other using a "voting" algorithm.

Another exemplary aspect of the invention is an integrated circuit. The integrated circuit contains multiple replicated cores, wherein each core includes a plurality of registers. Each core contains at least one scan chain formed by coupling registers within the core. The inputs of the scan chains are electrically coupled in parallel circuit. As a result of the input coupling, test pattern data may be provided to the scan chains of each core simultaneously. The integrated circuit may be configured to perform at least one computational operation on the test pattern data in the scan chains. The integrated circuit further contains a verification unit configured to process the outputs of the scan chains (which may now contain the results of the at least one computational operation.) To achieve this goal, the outputs of the scan chains are electrically coupled to the verification unit. The verification unit may be configured to compare the outputs of the scan chains to a reference signal configured to indicate an expected output. The verification unit may also be configured to compare the outputs of the scan chains to each other using a "voting" algorithm.

Yet another exemplary aspect of the invention is a system for testing an integrated circuit. The system includes a multi-core integrated circuit having the components and features described above. The system also includes a testing apparatus. The testing apparatus is electrically coupled to one or more electrically coupled inputs of the scan chains. The testing apparatus is configured to load test pattern data into the scan chains of the integrated circuit using the one or more electrically coupled inputs. The testing apparatus may also be configured to cause the integrated circuit to perform at least one computational operation on data provided to the integrated circuit via the scan chains. The testing apparatus may be electrically coupled to a reference signal coupled to the integrated circuit and may load an expected output into the reference signal. The testing apparatus may also be configured to analyze data received from the verification unit at the integrated circuit to determine the validity of the outputs of the scan chains and to indicate a malfunction of the integrated circuit if the outputs are determined not to be valid.

The foregoing and other features, utilities and advantages of the invention will be apparent from the following more particular description of various embodiments of the invention as illustrated in the accompanying drawings.

DETAILED DESCRIPTION OF THE INVENTION

Figure 1:
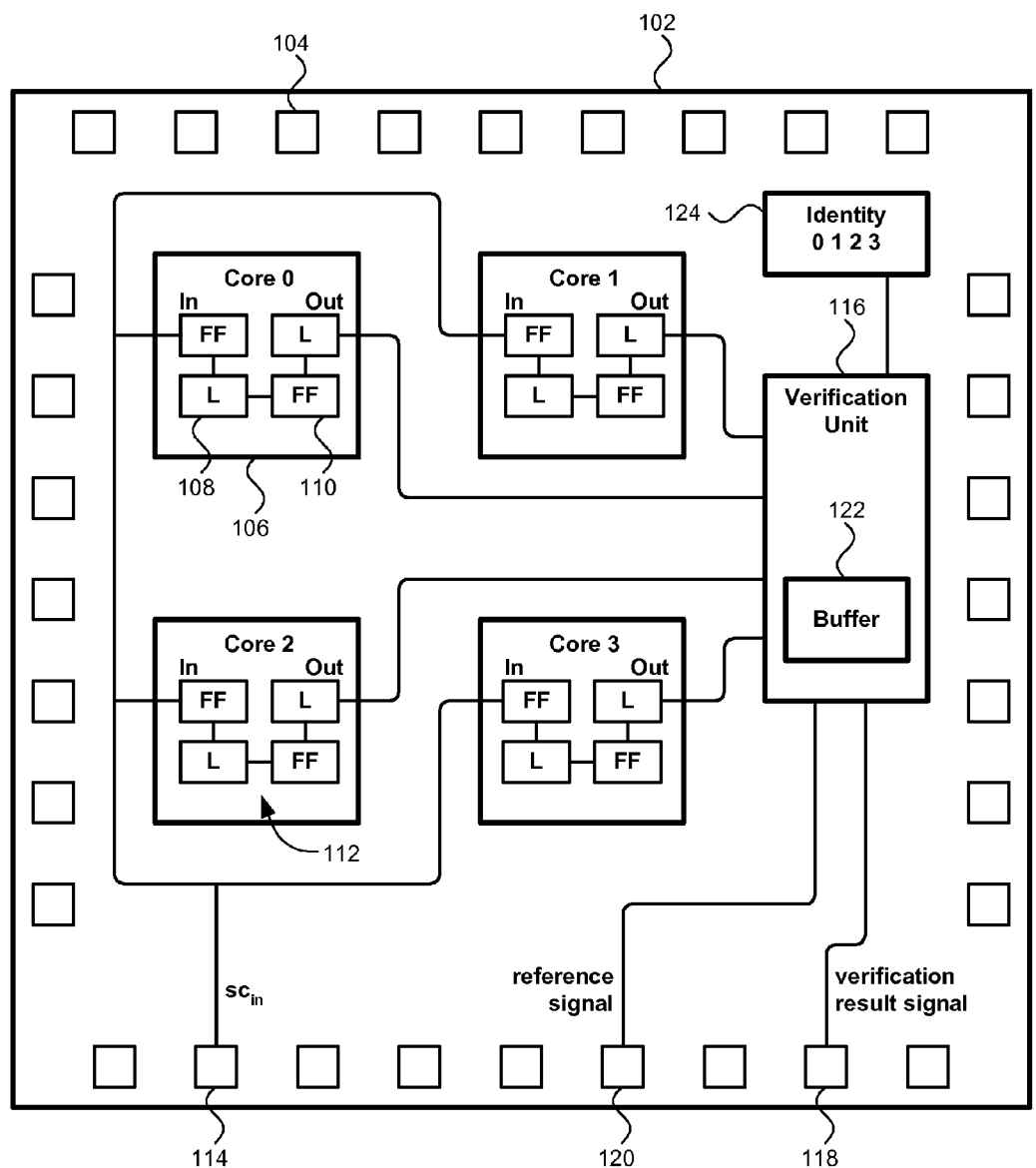
FIG. 1 shows an exemplary integrated circuit embodying the present invention.

The following description details how the present invention is employed to test a multi-core integrated circuit. Throughout the description of the invention reference is made to FIGS. 1-3. When referring to the figures, like structures and elements shown throughout are indicated with like reference numerals.

FIG. 1 shows an exemplary integrated circuit (IC) 102 embodying the present invention. The integrated circuit 102 may be manufactured on semiconductor material. It may include semiconductor devices and passive components. The IC may be configured to perform arithmetic and/or logic operations. Integrated circuits embodying the present invention may be designed to fulfill a wide range of goals. The IC 102 may exist for a general purpose. For example, it may be a microprocessor configured to execute arbitrary machine language instructions corresponding to a wide variety of computer program products. The IC 102 may also be configured for a specific purpose. For example, it may be configured to control a mechanical device.

The integrated circuit 102 may communicate with components to which it is coupled via input/output (I/O) pads 104. Microscopic wires typically connect IC components to the I/O pads. The I/O pads 104 may then be electrically coupled to IC pins (not shown) that are subsequently soldered to circuit boards.

The integrated circuit 102 may include multiple cores 106. The exemplary IC 102 includes four cores, numbered 0 through 3. A core may be any element of circuitry which is repeated at least twice within the integrated circuit 102. However, a core may additionally include elements of circuitry that are not identical to corresponding elements in other cores. In other words, intentional differences may exist between the cores of the integrated circuit 102. For example, two cores may have different hardwired serial numbers but may otherwise be identical. A core 106 may be configured to perform arithmetic and/or logic operations. In an embodiment of the present invention, each core 106 is a processor core.

A multi-core integrated circuit 102 may include circuitry other than the replicated cores. In particular, additional circuitry may be added to couple the replicated cores together. Moreover, the IC 102 may include resources shared by the replicated cores 106. Such resources may include memory accessible to all cores and/or a controller configured to coordinate operations among the replicated cores.

Each core 106 may contain a plurality of registers 108, 110. A register may be any technological device capable of storing data. The registers in the exemplary core include latches 108 and flip-flops 110, both of which are commonly used in the art. Latches in the figure are denoted with an "L" and flip-flops are denoted with an "FF". A latch is a technological device which may contain one or more bits of data and which may change its contents in response to received input data. A flip-flop is also a technological device that may contain one or more bits of data, but it may only change its contents in response to received input data upon receiving a clock pulse. It is emphasized that the inclusion of only four registers per core in the figure is solely due to space considerations. A core may contain any number of registers. Indeed, it is not uncommon for cores of modern integrated circuits to contain hundreds of thousands of registers.

Each core 106 may include one or more scan chains 112. A scan chain may facilitate scanning a test pattern into the registers 108, 110 of the core. A test pattern may be data provided as input to one or more computational operations performed within a core 106 to test that core. The scanning operation may thus result in each register containing a desired value, which may be the appropriate datum of the test pattern. The scan chain 112 may further facilitate retrieval of the contents of each register in the core 106 after at least one computational operation is performed on the test pattern. These values represent results of the one or more operations performed for testing purposes. Thus, validating these values is desirable in order to confirm that the core 106 produces valid results and is therefore functional.

A scan chain 112 may be created by using microscopic wires to couple registers within the core into one long shift register. A shift register can be conceptualized as a bucket brigade where at each pulse of a clock, every bucket (test pattern datum) in the bucket brigade is shifted one increment in the same direction. Specifically, the activation of a special test signal called "scan enable" may enable test patterns to be shifted into the scan chain. Upon each pulse of a clock, a new datum received at the input to the scan chain may be stored in the first register in the scan chain, and each datum already in the scan chain may be shifted forward to the next register. It is contemplated that each datum is a binary digit, commonly known in the art as a bit. Once all test pattern data are loaded into the scan chain, scan enable mode may be deactivated, which may cause the core to resume normal functional operation. Functional clock signals may then be pulsed one or more times to cause the core to perform at least one computational operation on the data provided to the core via the scan chain. To view the results of the functional operations, scan enable mode may be reactivated. Then, upon each pulse of a clock, the last datum in the scan chain may be transmitted to the output of the scan chain, and every other datum may be shifted forward to the next register. This operation allows the contents of each shift register to be viewed directly.

It is noted that a scan chain 112 does not need to be ordered according to the logical structure of the circuit and its registers. Likewise, the ordering of the scan chain does not need to consider the replication of logic blocks. It is contemplated that attributes such as physical proximity between registers and routing resources are considered to determine the ordering of registers in the scan chain 112. Generally speaking, what is important is that the scan chain 112 connects the registers in a well-defined order to facilitate loading specific test pattern data into specific registers.

The inputs of one or more scan chains 112 may be electrically coupled in parallel circuit to a scan in ($sc_{in}$) signal 114. The scan-in signal 114 may be implemented as an I/O pad 104. Thus, data input received at the scan-in signal 114 may be transmitted to the input of each of a plurality of scan chains 112. In an embodiment of the present invention, a single scan-in signal 114 exists and is electrically coupled to all scan chains 112 within the integrated circuit 102. In another embodiment of the present invention, a plurality of scan-in signals 114 exist, wherein each scan-in signal 114 is electrically coupled to one or more scan chains 112. It is noted that additional pins may facilitate the scanning in of test patterns. For example, a second pin may be configured to activate and deactivate scan enable mode. It is contemplated that a scan-in signal 114 may be multiplexed with another signal to reduce the number of pins on the integrated circuit 102. Thus, the scan-in signal 114 may only exist when the IC enters a special test mode such as scan enable.

Thus, the activation of scan enable may enable test patterns to be shifted into a plurality of scan chains 112 simultaneously. Upon each pulse of a clock, a new datum received at the scan-in signal 114 may be stored in the first register 108, 110 of each of the plurality of scan chains 112. Each datum already in a scan chain 112 may be shifted forward to the next register in the same scan chain 112. Once all test pattern data are loaded into the scan chain 112, scan enable mode may be deactivated, which may cause the integrated circuit 102 to resume normal functional operation. Functional clock signals may then be pulsed one or more times to cause the integrated circuit 102 to perform at least one computational operation on the data provided to the integrated circuit via the scan chains 112. To view the results of the functional operations, scan enable mode may be reactivated. Then, upon each pulse of a clock, the last datum in a scan chain 112 may be transmitted to the output of the same scan chain, and every other datum may be shifted forward to the next register of the same scan chain. This allows the contents of each shift register to be viewed directly.

A verification unit 116 may be electrically coupled to the outputs of the scan chains 112. The verification unit 116 may be configured to process the outputs of the scan chains 112. Processing may include analyzing the outputs of the scan chains 112 in order to determine their validity. As used herein, a valid output indicates a functional core and an invalid output indicates a non-functional core. This is possible because as previously noted, the outputs of the scan chains 112 may include the contents of all internal registers 108, 110 resulting from the execution of one or more operations. The verification unit may perform a variety of operations in order to process the outputs of the scan chains 112. The verification unit 116 may apply a variety of algorithms to analyze the scan chains 112 and to determine their validity. The verification unit 116 may be configured to indicate a malfunction of the integrated circuit 102 if the outputs are determined not to be valid. This indication may include transmitting a determination of whether or not a malfunction exists to a verification result signal 118. The verification result signal may be implemented as an I/O pad 104.

Malfunction may be indicated using a variety of techniques. In an embodiment of the present invention, at each clock cycle, the verification result signal transmits an accumulated result indicating whether all replicas provided a correct result.

In an embodiment of the present invention, the verification unit 116 at the integrated circuit 102 may not make the final determination of validity. The validity of the IC may instead be determined by logic external to the IC. The external logic may be implemented in hardware, software or a combination thereof. The verification result signal 118 may, instead of transmitting an indication of malfunction, instead transmit data to be analyzed by the external logic in order to determine the validity of the IC 102. Transmitting data via the verification result signal 118 may occur in response to a request from the external logic.

The verification unit 116 may be configured to compare the outputs of the scan chains 112 to an expected result. To achieve this result, a reference signal 120 originating outside the integrated circuit 102 may be coupled to the integrated circuit. The reference signal 120 may be implemented as an I/O pad 104. The reference signal 120 may be configured to indicate an expected output. It may transmit the expected output one bit at a time and may wait a defined period of time between bits. The verification unit 116 may be configured to validate the outputs of the scan chains by comparing them to the reference signal 120.

It is noted that while the exemplary integrated circuit 102 only includes one reference signal 120, a plurality of reference signals may exist. This may advantageously allow multiple bits of the expected result to be simultaneously provided to the verification unit 116. However, it is contemplated that each reference signal 120 requires a separate pin. Additional pins generally increase the cost of the integrated circuit 102; an implementer of the present invention must weigh this disadvantage against the advantage of faster provision of a reference signal.

In an embodiment of the present invention, the reference signal 120 is provided to the integrated circuit 102 in synchronization with the output of the scan chains 112. Specifically, the reference signal 120 may provide a datum of expected output to the verification unit 116 concurrently with the receiving of the corresponding datum of actual scan chain output at the verification unit 116. As noted previously, the scan chains 112 are driven by a clock operating at a determinate frequency. Thus, the reference signal 120 may be driven at the same frequency to achieve this result. This method may advantageously reduce storage requirements because the reference signal may not need to be stored at the IC 102. Rather, the actual datum of the output of the scan chains received may simply be compared to the current value of the reference signal 120.

The verification unit 116 may also be configured to validate the outputs of the scan chains 112 by comparing them to each other. This method may be thought of as "voting." For example, if cores 0, 1 and 3 produce one result and core 2 produces a different result, the validity of core 2 may justifiably be questioned. Voting is possible because each datum in a scan chain has a comparatively high accuracy. It follows that the probability that a majority of output data are incorrect may be acceptably low under most scenarios, assuming a random distribution of errors.

Voting may be used in conjunction with comparison to a reference signal 120. In this case, the results of the voting operation and the results of the comparison operation may both be provided. This may be accomplished either by using a separate verification result signal 118 for both results or by multiplexing both results onto a single verification result signal. In an embodiment of the present invention, separate logic units perform the voting operation and the comparison operation. The logic unit configured to perform the voting operation may be invoked first. The voting result may then be provided to a second logic unit configured to perform the comparison operation.

Voting may also occur in the absence of a reference signal 120. In this case, the voting result may be conceptualized as a reference signal generated internally within the integrated circuit 102. In either case, the voting result may be provided to allow for later verification outside the IC. Alternatively, a checksum or signature of the voting results may be generated to reduce data volume while still allowing external verification.

A variety of algorithms may be used to validate the outputs of the scan chains 106 by comparing them to each other. Some algorithms may require more than one clock cycle to achieve this validation. However, as previously mentioned, the output of the scan chains 106 may be received at the verification unit 116 at a rate of one datum per clock cycle. To allow the utilization of such algorithms, the verification unit 116 may include a buffer 122. The buffer 122 may be configured to store outputs of the scan chains 106. The verification unit 116 may be configured to validate the outputs of the scan chains 106 by comparing the outputs of the scan chains stored in the buffer 122 to each other. Thus, the need to perform the voting algorithm in real time is avoided.

The verification unit 116 may be configured to indicate the malfunction of the integrated circuit 102 as a whole when the outputs of one or more scan chains 112 are determined not to be valid. However, an IC 102 containing one or more cores 106 which do not produce valid results may also include one or more properly functioning cores. Therefore, the verification unit 116 may also be configured to use the outputs of the scan chains to determine the validity of one or more individual cores in the integrated circuit 102. In other words, the verification unit may distinguish between good cores and bad cores. An indication of malfunction may indicate the identity of the specific cores that are determined not to be valid.

Furthermore, some multi-core integrated circuits 102 known in the art may be configured to selectively disable specific cores. Thus, the verification unit 116 may be configured to record, at the integrated circuit 102, an identity 124 of one or more cores having outputs of the scan chains 112 that are determined not to be valid. The identity may be recorded using any of a variety of micro-electronic storage devices capable of storing sufficient data to indicate the validity or non-validity of each individual core 106. The integrated circuit 102 may be configured to automatically disable any core listed in the identity as not being valid.

Additionally, some integrated circuit designs known in the art are cost effective to repair. While it is typically very expensive to repair integrated circuits due to the micro-electronic operations required, it may be even more expensive to replace the IC entirely. Therefore, repairing operations may be performed on one or more cores in the integrated circuit having outputs of the scan chains 112 that are determined not to be valid.

In another aspect of repair, IC's may ship with a varying number of cores, or may be designed with spare cores to substitute for one or more faulty cores. Identifying the number and identity of correct and faulty cores can be used to select how many functional cores may be available, and if spare cores are provided, what cores to configure to be replaced with spare cores. Appropriate configuration information is then stored either on-chip or off-chip. The configuration information may be stored in a variety of storage formats, including without limitation configuration ROM's, flash memory and one-time programmable fuses.

As previously noted, differences may exist between otherwise identical cores 106. It is contemplated that such differences are minor. By example and without limitation, each of several replicated cores may have a unique serial number intended to distinguish the core from any other core ever manufactured. Such differences between cores may cause the outputs of the scan chains to differ from each other and/or from a reference signal 120 when the differences impact the operations performed by each individual core 106. For example, an operation in which a serial number unique to each core is used to digitally sign a message will provide different results for different cores. To allow for this possibility, the verification unit 122 may be configured to not use outputs of the scan chains for verification when, for a specific set of outputs, a possibility exists that the outputs will differ from each other on a correctly functioning integrated circuit due to intentional differences between the cores of the integrated circuit. To test operations that differ from core to core, additional scan chains not electrically coupled to each other may be applied to individual cores. Additionally, the differences between cores may be so minor as to be feasibly tested without the use of scan design methods. For example, the serial numbers of individual cores may be simply queried using the standard functionality offered by the IC for this purpose and may be compared to their expected values.

It is contemplated that the present invention may be applied to a wide variety of integrated circuits. Many integrated circuits known in the art have unique requirements. To meet these requirements, variations of the embodiment shown in FIG. 1 may be beneficial. Therefore, additional embodiments of the present invention that may be beneficial in some IC designs are discussed below. The examples discussed are not intended to limit the scope of the present invention.

More than one verification unit 116 may be included in an integrated circuit 102. In an embodiment of the present invention, the integrated circuit 102 includes one verification unit for each core 106. Each verification unit may be coupled to a core and may validate the output of the scan chain or scan chains related to that core.

In an embodiment of the present invention, each core 106 includes a plurality of scan chains 112. The input to each scan chain may be coupled to a separate scan-in signal 114. The output of each scan chain may be coupled to a separate verification unit 116. If applicable, each scan chain may be coupled to a separate reference signal 120.

In another embodiment of the present invention, a scan chain 106 may connect a plurality of cores 106 in series. Specifically, the scan chain may include registers 108, 110 from two or more distinct cores. The scan chains including such serially connected cores may exist in parallel to one or more other scan chains serially connecting other cores. For example, a single scan chain may connect cores 0 and 1 while another single scan chain may connect cores 2 and 3.

Finally, it is emphasized that scan compression techniques known in the art may be used in conjunction with the present invention. One such technique involves sharing test pattern data between scan chains 112 not testing replicated cores 106. Another technique that may be combined with the present invention is to utilize multiple, shorter scan chains within an individual core in lieu of one, longer scan chain. The scan chains 112 including the same registers in different replicated cores may be electrically coupled to a scan-in signal 114 using the method of the present invention. It is noted that one scan-in signal per set of related scan chains may thus exist. Another technique is for the scan-in signal 114 of the present invention to be multiplexed onto a pin also used for other purposes. Compression techniques known in the art may be applied to input data provided to electrically coupled scan chains 112 using the techniques of the present invention. The speed at which data may be entered into the scan chains 112 via the scan-in signal 114 may be increased using various techniques known in the art. Finally, Logical Built-In Self Test (LBIST) may be combined with the method of the present invention. In accordance with one embodiment of the present invention, signatures are computed in response to test cycles, and the verification unit compares these signatures to a reference signal.

Figure 2:
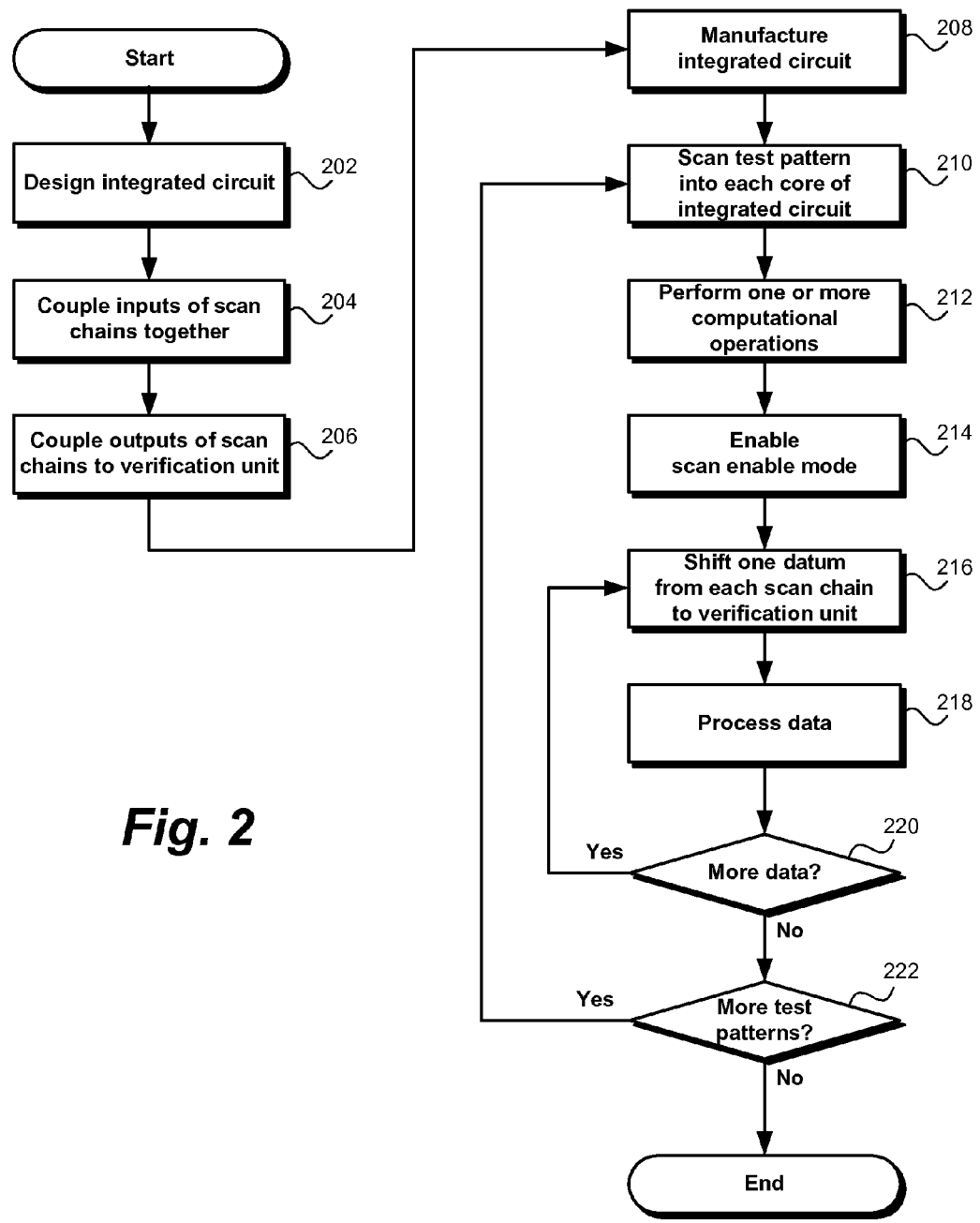
FIG. 2 illustrates an exemplary flowchart of operations performed to test a multi-core integrated circuit, as contemplated by the present invention.

Turning now to FIG. 2, an exemplary flowchart of operations performed to test a multi-core integrated circuit, as contemplated by the present invention, is demonstrated. It is noted that the operations include not only those performed during a testing phase but also those performed during a design phase. While a substantial period of time may elapse between the design and testing phases, the operations performed during design of the IC are typically prerequisites to those performed to test a manufactured instance of the IC. Therefore, the design operations and testing operations are presented here in chronological order.

At designing operation 202, an integrated circuit is designed. As previously mentioned, integrated circuits embodying the present invention may be designed to fulfill a wide range of goals. The integrated circuit may include multiple cores. As previously discussed, a core may be any element of circuitry that is repeated at least twice within the integrated circuit. However, a core may additionally include elements of circuitry that are not identical to corresponding elements in other cores. In an embodiment of the present invention, each core is a processor core.

The designing operation 202 may begin with the design of a single core. This may include designing a plurality of registers to be included in the core as well as designing interconnections between the registers. As previously discussed, a register may be any technological device capable of storing data, including without limitation latches and flip-flops. The core may then be replicated multiple times within the same integrated circuit design. Additional circuitry within the integrated circuit may be designed to couple the cores together. Resources within the integrated circuit to be shared by the replicated cores may also be designed. Such resources may include memory accessible to all cores and/or a controller configured to coordinate operations among the replicated cores.

The designing operation 202 may include addition of circuitry to the integrated circuit primarily to facilitate testing of the IC. It is noted that such circuitry generally has no harmful effects during functional operation. Thus, the circuitry can safely be sold along with the rest of the IC to the end user. This may be beneficial, because it is typically unfeasible to remove the testing circuitry once the IC has been tested. Such circuitry may facilitate reading and writing the internal state of the IC more directly than is possible during normal operation. Specifically, one or more scan chains may be added to each core to facilitate scanning a test pattern into the registers of the cores. A scan chain may be configured by using microscopic wires to couple a plurality of registers within a core into one long shift register. A shift register can be conceptualized as a bucket brigade where at each pulse of a clock, every bucket (test pattern datum) in the bucket brigade is shifted one increment in the same direction. Furthermore, a verification unit may be designed to process the outputs of the scan chains. The verification unit may be included within the IC.

At input coupling operation 204, the inputs of the scan chains are coupled together such that the inputs of the scan chains are electrically connected in parallel circuit. It is contemplated that the coupling includes the corresponding scan chains within each replicated core. The coupled inputs of the scan chains may be further coupled to a scan-in signal at which test pattern data are received for loading into each of the scan chains. It is not required that the inputs of all scan chains within an IC are coupled together and that the coupled inputs are further coupled to a single scan-in signal. Instead, multiple sets of coupled scan chains may be designed, wherein the inputs of the scan chains within each set are coupled to each other and wherein a separate scan-in signal is coupled to the coupled inputs for each set.

At output coupling operation 206, the outputs of the scan chains are coupled to the verification unit. As a result, the verification unit may receive a separate output for each scan chain. After the IC design is completed, the process continues to manufacturing operation 208.

At manufacturing operation 208, the integrated circuit designed in the preceding operations is manufactured. Manufacturing may include any of a variety of processes known in the art for converting a design of an integrated circuit into a tangible, physical form. It is noted that a significant gap in time may occur between the design and coupling operations and the manufacturing operation 208.

At scanning operation 210, a test pattern is scanned into the registers of the integrated circuit via the coupled inputs of the scan chains. A test pattern may be data provided as input to one or more computational operations performed within a core to test that core. Because input coupling operation 204 may have coupled the inputs to the corresponding scan chains in each replicated core, the same test pattern may be scanned into each core simultaneously. Thus, the corresponding registers in each replicated core may each contain a desired value, which may be the appropriate datum of the test pattern.

Specifically, the activation of a special test signal called "scan enable" may enable test patterns to be simultaneously shifted into a plurality of scan chains coupled during input coupling operation 204. Upon each pulse of a clock, a new datum received at a scan-in signal may be stored in the first register of each of the plurality of scan chains coupled to that scan-in signal. It is contemplated that each datum is a bit. Each datum already in a scan chain may be shifted forward to the next register in the same scan chain. Once all test pattern data are loaded into the scan chains, scan enable mode may be deactivated.

At computing operation 212, functional operations are performed on the test data provided in scanning operation 210. Deactivation of scan enable mode may cause the integrated circuit to resume normal functional operation. Therefore, functional clock signals may be pulsed one or more times to cause at least one computational operation to be performed at the integrated circuit on data provided to the integrated circuit via the scan chains. It is contemplated that each core separately performs the same computational operations. After computing operation 212 is completed, control passes to enabling operation 214.

At enabling operation 214, scan enable mode is enabled again to allow later operations to view the results of computing operation 212. At this point, the contents of each register in each core may represent the results of computing operation 212. Validating the contents of the registers is therefore desirable in order to confirm that each core produced valid results. Enabling scan enable mode allows the contents of the registers to be retrieved for validation via the outputs of the scan chains. After enabling operation 214 is completed, control passes to shifting operation 216.

At shifting operation 216, a datum is shifted from the output of each scan chain to the verification unit. This action may be triggered by a clock pulse. The clock pulse may cause the last datum in each scan chain to be transmitted to the output of the same scan chain. Because the outputs of each scan chain were coupled to the verification unit at output coupling operation 206, the data are therefore transmitted to the verification unit. It is emphasized that the verification unit may thus receive one datum per scan chain. The clock pulse may also cause every other datum to be shifted forward to the next register of the same scan chain.

At processing operation 218, the result data received from the outputs of the scan chains is processed at the verification unit. Processing may include analyzing the data in order to aid in determining the validity of the results of computing operation 212. When the outputs of the scan chains have been completely transmitted, the verification unit will generally have received the entire result from each core. Therefore, the verification unit may obtain sufficient data to determine the validity of the integrated circuit.

A variety of operations may be performed in order to process the received data. A variety of algorithms may be applied to analyze the datum and to determine its validity. A malfunction of the integrated circuit may be indicated if processing the datum yields a determination that the results of computing operation 212 are not valid.

Malfunction may be indicated using a variety of techniques. In an embodiment of the present invention, an accumulated result is transmitted indicating whether each replicated core provided a valid result. In another embodiment of the present invention, the validity or non-validity of the results of computing operation 212 for each replicated core may be accumulated at the integrated circuit for later retrieval.

Processing the data may include comparing each datum to an expected result. The expected result may be provided via a reference signal originating outside the integrated circuit and configured to indicate an expected output. The expected result may be transmitted one bit at a time with a defined period of waiting time between bits. Thus, a comparison operation occurring at the integrated circuit may compare the outputs of the scan chains against the reference signal. In an embodiment of the present invention, the comparison operation is performed using the following VHSIC Hardware Description Language (VHDL) fragment:

fail <=fail OR (sout & sout & sout & sout) XOR (ref & ref & ref & ref);

It is noted that while the VHDL fragment listed above is designed for an integrated circuit having four cores, it may be easily modified by one skilled in the art to apply to an IC having any number of cores.

In an embodiment of the present invention, the reference signal is provided to the integrated circuit in synchronization with the output of the scan chains. Specifically, the reference signal may provide a datum of expected output to the verification unit concurrently with the receiving at the verification unit of the corresponding datum of actual scan chain output from each scan chain. As noted previously, the scan chains are driven by a clock operating at a determinate frequency. Thus, the reference signal may be driven at the same frequency to achieve this result. This method may advantageously reduce storage requirements because the reference signal may not need to be stored at the IC. Rather, the actual data received as output from the scan chains may simply be compared to the current value of the reference signal.

Processing the data may also include comparing the outputs of the scan chains to each other to determine the validity of the outputs. Simply put, this operation may be thought of as "voting." For example, if cores 0, 1 and 3 produce one result and core 2 produces a different result, the validity of core 2 may justifiably be questioned. Voting is possible because each datum in a scan chain has a comparatively high accuracy. This is evident because otherwise, a given IC design would have an unacceptably low yield for volume manufacturing. It follows that the probability that a majority of output data are incorrect may be acceptably low under most scenarios, assuming a random distribution of errors.

A voting operation may be performed in conjunction with a comparison operation to a reference signal. In this case, the two operations may have separate indications of malfunction. A voting operation may also be performed instead of a comparison operation to a reference signal. In this case, the result of the voting operation may be conceptualized as a reference signal generated internally within the integrated circuit. In either case, the voting result may be provided to allow for later verification outside the IC. Alternatively, a checksum or signature of the voting results may be generated to reduce data volume while still allowing external verification.

A variety of algorithms may be used to validate the outputs of the scan chains by comparing them to each other. Some algorithms may require more than one clock cycle to achieve this validation. However, as previously mentioned, the output of the scan chains may be received at the verification unit at a rate of one datum per clock cycle. To allow the utilization of such algorithms, the outputs of the scan chains may, upon being received during the shifting operation 216, be stored in a buffer. The algorithms used to determine the validity of the outputs of the scan chains may then be based upon the contents of the buffer rather than on the most recent data received.

A malfunction of the integrated circuit as a whole may be indicated when the results of computing operation 212 are determined not to be valid. However, an IC containing one or more cores which do not produce valid results may also include one or more properly functioning cores. Therefore, the verification unit may also be configured to use the outputs of the scan chains to determine the validity of one or more individual cores in the integrated circuit. In other words, the verification unit may distinguish between good cores and bad cores. An indication of malfunction may include the identity of the specific cores that are determined not to be valid.

Furthermore, some multi-core integrated circuits known in the art may be configured to selectively disable specific cores. Thus, the identity of one or more cores having outputs of the scan chains that are determined not to be valid may be recorded at the integrated circuit. The integrated circuit may automatically disable any core listed in the identity as not being valid.

Additionally, some integrated circuit designs known in the art are cost effective to repair. Repairing integrated circuits can be carried out, for example, by blowing one or more fuses that enable a redundant circuit structure when the current circuit structure is determined to be malfunctioning. Therefore, repairing operations may be performed on one or more cores in the integrated circuit having outputs of the scan chains that are determined not to be valid.

As previously noted, differences may exist between otherwise identical cores. It is contemplated that such differences are minor. By way of example and without limitation, each of several replicated cores may have a unique serial number intended to distinguish the core from any other core ever manufactured. Such differences between cores may cause the outputs of the scan chains to differ from each other and/or from a reference signal when the differences impact the operations performed by each individual core. For example, an operation in which a serial number unique to each core is used to digitally sign a message will provide different results for different cores. To allow for this possibility, the outputs of the scan chains may not be used for verification when, for a specific set of outputs, a possibility exists that the outputs will differ from each other on a correctly functioning integrated circuit due to intentional differences between the cores of the integrated circuit.

At determining operation 220, it is determined whether more result data exists in the scan chains. If so, processing returns to shifting operation 216 so that the remaining result data can be processed. If no more result data exists in the scan chains, scan enable mode may be deactivated and processing continues to determining operation 222.

At determining operation 222, it is determined whether more test patterns should be performed. If so, processing returns to scanning operation 210 in order to scan the next test pattern. If no more test patterns should be performed, the testing phase has completed and the process ends.

Figure 3:
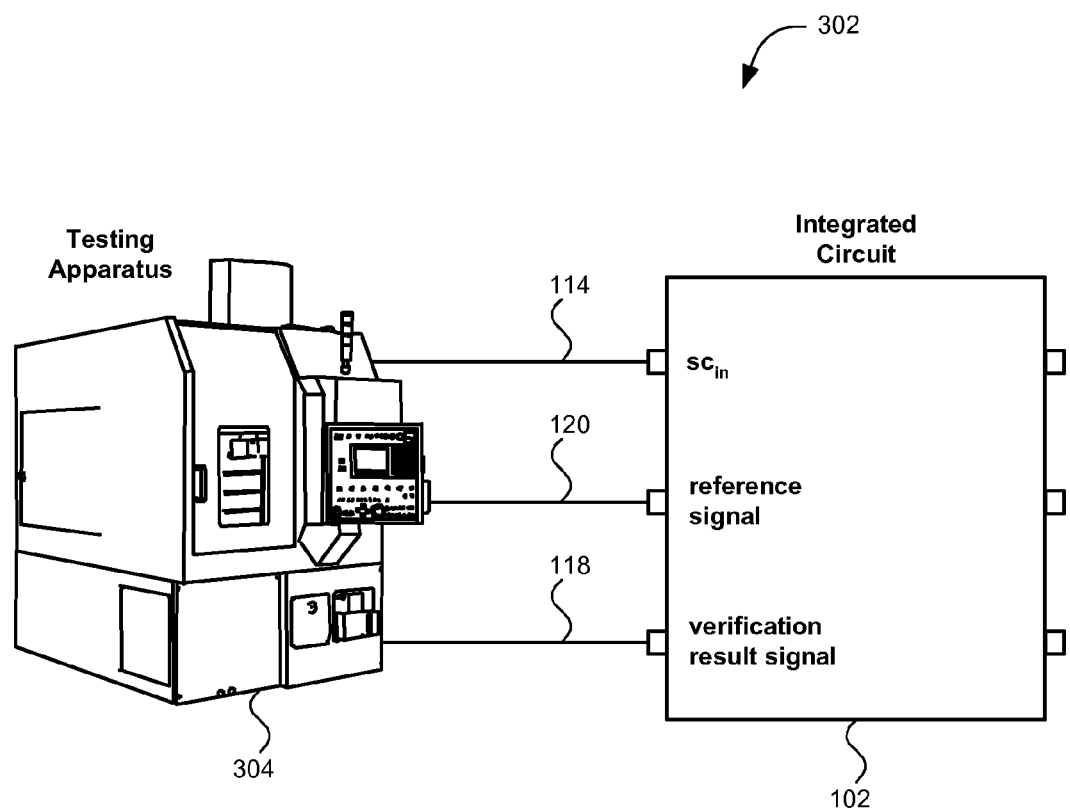
FIG. 3 illustrates an exemplary system for testing an integrated circuit, the system embodying the present invention.

Turning now to FIG. 3, an exemplary system for testing an integrated circuit in accordance with an embodiment of the present invention is shown.

The system 302 includes a multi-core integrated circuit 102. The integrated circuit 102 may be of a nature described above. Specifically, the integrated circuit 102 may include multiple cores, wherein each core may include a plurality of registers configured to form at least one scan chain. Inputs of the scan chains may be coupled together such that the inputs of the scan chains are electrically connected in parallel circuit. The outputs of the scan chains may be coupled to a verification unit. The verification unit may be configured to process the outputs of the scan chains.

The system 302 also includes a testing apparatus 304. The testing apparatus may be configured to effect and control testing of the integrated circuit 102 to ensure that it produces valid results. The testing apparatus may be implemented in hardware, software or a combination thereof. Software embodying aspects of the present invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

In an embodiment of the present invention, the testing apparatus is implemented in software on one or more appropriately programmed general-purpose digital computers having a processor, memory and input/output interfaces.

In an embodiment of the present invention, the determination of whether or not the integrated circuit 102 produces valid results occurs entirely at the integrated circuit. It is emphasized that even in this embodiment, the testing apparatus 304 may play important roles in the testing process, including without limitation loading the test data and receiving the determination of validity from the IC. In another embodiment of the present invention, processing the outputs of the scan chains at the integrated circuit may assist in the goal of classifying the integrated circuit as valid or invalid but may not result in a final determination. Instead, the testing apparatus 304 may use data provided by the verification unit to make the final determination of validity.

The testing apparatus 304 may be configured to select appropriate test patterns to effect testing of the integrated circuit 302. It is noted that methods are known in the art for determining the number and nature of test patterns that should be performed to achieve a desired statistical confidence level that an IC is functioning properly. Furthermore, software exists in the art to determine a minimum set of test vectors required to test relevant combinations within an integrated circuit.

The testing apparatus 304 may be electrically coupled to one or more scan chain inputs. Specifically, electrically coupled inputs of the scan chains may be coupled to a scan in ($sc_{in}$) signal 114. The testing apparatus may be electrically coupled to the scan-in signal. Using this connection to the one or more electrically coupled inputs, the testing apparatus may be configured to load test pattern data into the scan chains of the integrated circuit. As a result, each register of each core may be instantiated with desired values, with corresponding registers in replicated cores generally containing the same values. The details of this process are discussed in detail above.

The testing apparatus 304 may be configured to affect one or more testing operations on the data previously loaded. Specifically, the testing apparatus 304 may cause the integrated circuit 102 to perform at least one computational operation on the data provided to the integrated circuit via the scan chains. At the conclusion of the testing operations, the testing apparatus may effect operations and/or transmit signals intended to assist the verification unit in its processing of the outputs of the scan chains. Specifically, the testing apparatus 304 may activate scan enable mode and/or activate a clock in order to send the outputs of the scan chains to the verification unit.

The testing apparatus 304 may be configured to receive the results of the processing of the outputs of the scan chains by the verification unit at the integrated circuit 102. The testing apparatus 304 may be electrically coupled to a verification result signal 118 and may receive the results of the processing via this signal. Then, the testing apparatus 304 may be configured to analyze the data received from the verification unit to determine the validity of the outputs of the scan chains. The testing apparatus 304 may further be configured to indicate a malfunction of the integrated circuit if the outputs are determined not to be valid.

It is noted that an indication of malfunction may not be absolutely conclusive, but instead may specify whether or not a specific statistical confidence level exists that the integrated circuit 102 is functioning properly. Thus, indication of a malfunction may indicate that a problem with the IC likely exists. Conversely, not indicating a malfunction may increase the confidence level that the integrated circuit is functioning properly but may not prove it with absolute certainty.

In an embodiment of the present invention, the system 302 is configured to compare the outputs of the scan chains to an expected output in order to determine the validity of the integrated circuit 102. To achieve this goal, the system 302 may include a reference signal 120 originating outside the integrated circuit 102 and coupled to the integrated circuit. The testing apparatus 304 may be electrically coupled to the reference signal and may be configured to load an expected output into the reference signal. The testing apparatus 304 may transmit the expected output one bit at a time and may wait a defined period of time between bits. The verification unit may be configured to validate the outputs of the scan chains by comparing them to the reference signal. In a further embodiment of the present invention, the testing apparatus 304 is configured to provide the reference signal 120 to the integrated circuit 102 in synchronization with the output of the scan chains.

In a particular embodiment of the invention, an expected hash value is determined outside the integrated circuit. A hashing function is used to transform the expected output into the expected hash value. The expected hash value is typically a smaller size than the expected output and reflective of the expected output. For example, the hashing function may return the number of zeros and ones in the expected output. At the integrated circuit, a scan chain hash value is similarly computed for the scan chain outputs. The expected hash value and the scan chain hash value are then compared at the integrated circuit. If the hash values match, there is increased confidence that the scan chain results are correct and the integrated circuit is functioning as expected.

In another embodiment of the present invention, the system 302 is configured to validate the outputs of the scan chains by comparing them to each other. Simply put, this method may be thought of as "voting." The integrated circuit 102 may perform the voting operation without relying on input from the testing apparatus 304. However, the testing apparatus 304 may nonetheless load the test pattern data, receive the verification result and generally control the testing process.

The system 302 may be configured to store the results of processing of the outputs of the scan chains at the integrated circuit 102. In this case, the stored results may include the raw outputs of the scan chains. The stored results may also include results of tests performed on the outputs at the integrated circuit 102. The test results may reflect processing of the data but may stop short of conclusively classify the integrated circuit as valid or not valid. The testing apparatus 304 may then analyze the data stored at the integrated circuit 102 to make a final determination of the validity of the integrated circuit. It may request stored data to be transmitted from the integrated circuit. The verification result signal 118 may, instead of transmitting a determination of validity, instead transmit data to be analyzed by the testing apparatus in order to determine the validity of the integrated circuit.

Accordingly, in an embodiment of the present invention, the validity or non-validity of the outputs of the scan chains may be accumulated in state elements within the verification unit at the integrated circuit 102. This data may later be retrieved during scan procedures which may be controlled by the testing apparatus 304. In a further embodiment of the present invention, a method to select the output of a specific scan chain (e.g., the scan chain for a specific core) may be provided. A multiplexer may be used to facilitate the selection. This embodiment beneficially facilitates the detailed analysis of individual chains. Such analysis may be advantageous during bringup test (e.g., to find design problems during initial hardware verification.) The analysis may also be exercised in parallel during high volume manufacturing.

In another embodiment of the present invention, the testing apparatus 304 may request and receive the results from a single scan chain stored at the integrated circuit under configurable control. It may compare this result to an actual expected output. It is noted that this is conceptually similar to providing a reference signal 120, but because the decision is made at the testing apparatus 304, no reference signal needs to be provided. The testing apparatus 304 may also request and receive the accumulated results concerning the validity or non-validity of the outputs of the scan chains. These results may have been stored at the integrated circuit 102 as discussed above. The testing apparatus 304 may then analyze both sets of results to classify the integrated circuit 102 as valid, partially valid or not valid. A partially valid classification may include classification of individual cores as valid or not valid. In this case, the testing apparatus 304 may configure the integrated circuit 102 to use only those cores determined to be valid.

An exemplary algorithm by which the testing apparatus 304 determines the validity of an integrated circuit 102 begins with performing scan testing as described above. The outputs of the scan chains may be analyzed to classify the integrated circuit 102 as valid or not valid. If the outputs are determined to be invalid, additional testing may be performed and/or one or more cores determined to be invalid may be repaired. If the outputs are determined to be valid, the contents of the registers may be read. If the scan chains agree for each register, the integrated circuit 102 may be classified as good. If not, the IC may be classified as partially good. The active state may be used to determine which cores produced valid results.

In an embodiment of the present invention, an isolation capability and/or logic may be provided around instantiated cores to ensure that scan chain testing has the same behavior on all cores. This may allow for abstract per-instance behavior.

In another embodiment of the present invention, scan paths may be generated to separate per-core specific patterns from shared paths. The testing apparatus 304 may support the generation of scan paths in this manner. Thus, differences between cores, such as a unique serial number per core, may be placed on separate scan chains.

Figure 4:
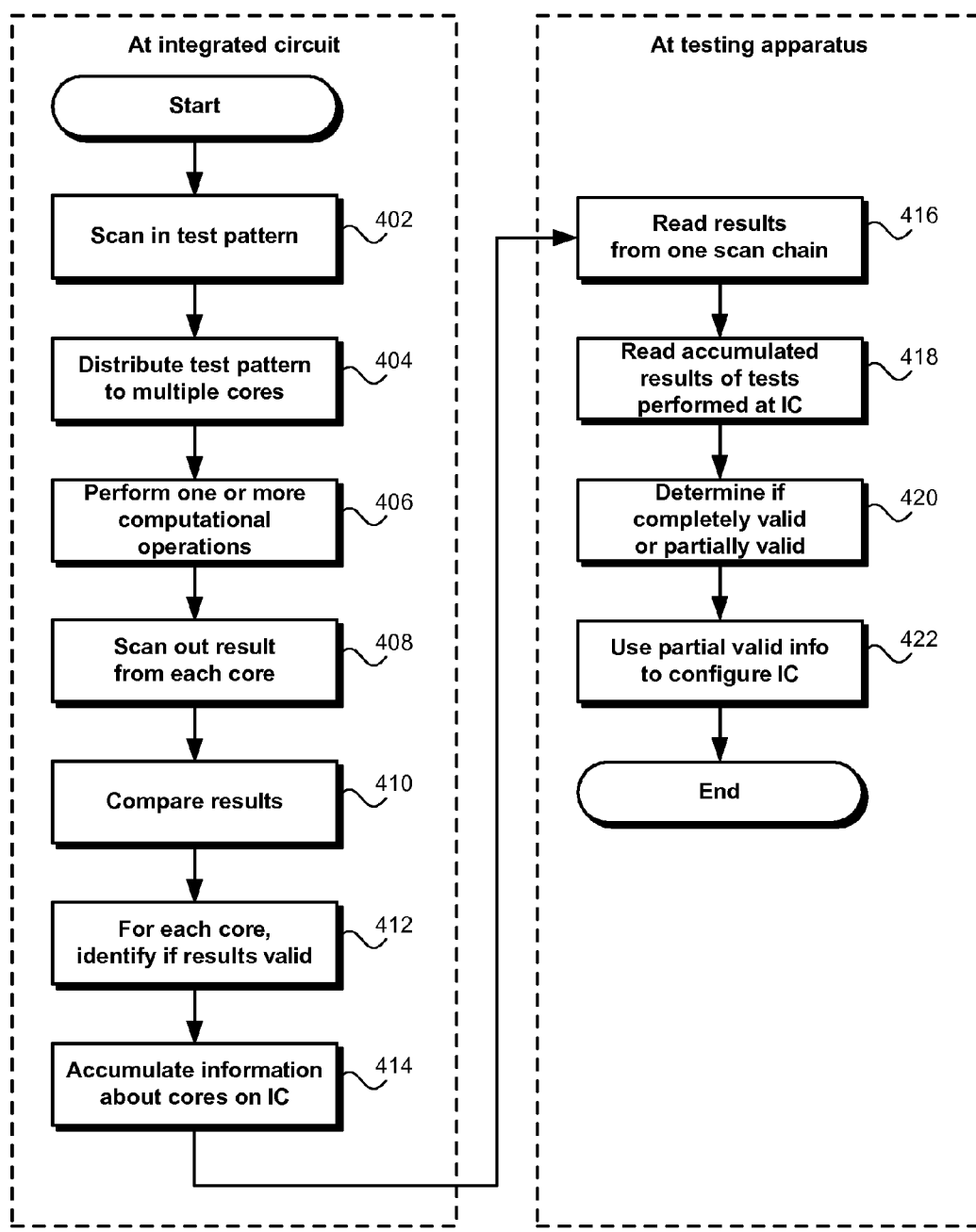
FIG. 4 illustrates an exemplary flowchart of operations performed by the exemplary system of FIG. 3 to test a multi-core integrated circuit.

FIG. 4 illustrates an exemplary flowchart of operations performed by the exemplary system of FIG. 3 to test a multi-core integrated circuit. The flowchart demonstrates an exemplary division between operations performed at the integrated circuit and operations performed at the testing apparatus. It is noted that when a particular operation is performed at the integrated circuit, the testing apparatus may nonetheless assist with and/or invoke that operation. It is emphasized that many (but not necessarily all) of the operations shown as being performed at the integrated circuit may instead be performed at the testing apparatus without departing from the scope and spirit of the present invention. Similarly, many (but not necessarily all) of the operations shown as being performed at the testing apparatus may instead be performed at the integrated circuit. Furthermore, it is emphasized that other sequences of operations may be performed by the system of FIG. 3 to test a multi-core integrated circuit without departing from the scope and spirit of the present invention. Such operations may be divided between the integrated circuit and the testing apparatus according to the principles discussed herein.

At scanning operation 402, a test pattern is scanned into the integrated circuit. A test pattern may be data provided as input to one or more computational operations performed within a core to test that core. The testing apparatus may select the test pattern based on considerations previously discussed. The testing apparatus may provide the test pattern to the integrated circuit via a scan in ($sc_{in}$) signal at the integrated circuit to which the testing apparatus is electrically coupled. To achieve this goal, the testing apparatus may first activate a special test signal called "scan enable." Then, the testing apparatus may provide the test pattern data via the scan in signal, waiting a predefined period of time between one datum and the next.

At distributing operation 404, the test patterns provided to the integrated circuit during scanning operation 402 are distributed among the plurality of scan chains. It is contemplated that the integrated circuit comprises a clock having a frequency matching the rate at which the test patterns are provided to the integrated circuit. Thus, at each pulse of the clock, a different datum provided during scanning operation 402 is processed. As previously discussed, a scan in signal may be electrically coupled to each of a plurality of scan chains. Thus, the test pattern datum at the scan in signal may be stored in the first register of each of the plurality of scan chains coupled to that scan in signal. Each datum already in a scan chain may be shifted forward to the next register in the same scan chain. Accordingly, each clock cycle advances the distribution of the test pattern data. It is contemplated that after a number of clock cycles equal to the length of the scan chains, all test pattern data are loaded into the scan chains. As a result, each register of each core may be instantiated with desired test pattern values, with corresponding registers in replicated cores generally containing the same values.

At computing operation 406, one or more functional operations are performed on the test data provided during scanning operation 402 and distributing operation 404. To achieve this goal, the testing apparatus may deactivate the scan enable signal, causing the integrated circuit to resume normal functional operation. Therefore, functional clock signals may be pulsed one or more times to cause at least one computational operation to be performed at the integrated circuit on data provided to the integrated circuit via the scan chains. It is contemplated that each core separately performs the same computational operations.

At scanning operation 408, the results of computing operation 406 are scanned out from the registers of the scan chains to a verification unit at the integrated circuit. This process is analogous to scanning operation 404, except the goal is to read data from the end of the scan chains as opposed to loading data into the beginning of the scan chains. To achieve this goal, the testing apparatus reactivates the scan enable signal. As previously discussed, each scan chain may be electrically coupled to a verification unit. Thus, upon each pulse of a clock, a datum is shifted from the output of each scan chain to the verification unit. It is emphasized that the verification unit may thus receive one datum per scan chain per clock cycle. The clock pulse may also cause every other datum to be shifted forward to the next register of the same scan chain. Accordingly, each clock cycle advances the scanning out of the results to the verification unit. It is contemplated that after a number of clock cycles equal to the length of the scan chains, the entire contents of each scan chain resulting from computing operation 406 may be received at the verification unit.

At comparing operation 410, the outputs of the scan chains resulting from computing operation 406 are processed at the verification unit at the integrated circuit. The outputs may be compared to a reference signal provided by the testing apparatus and configured to indicate an expected output. The outputs may also be compared to each other according to the previously described "voting" algorithm. Both of these algorithms may be applied concurrently. It is emphasized that the algorithms which may be applied to process the outputs of the scan chains are not limited to those listed here. A wide variety of additional comparison algorithms may be used without departing from the scope and spirit of the present invention.

At determining operation 412, the verification unit at the integrated circuit determines the validity of the results of computing operation 406. As used herein, valid results are defined as results that match either excepted results supplied externally, or voted results supplied by the cores under test. In either case, valid results indicate functional cores and invalid results indicate non-functional cores. The validity of the results may be determined separately for each core. Methods to determine validity when comparing the outputs to a reference signal and when comparing the outputs to each other in a voting algorithm have been discussed above. Such methods may be used here in order to determine the validity of the results.

At accumulating operation 414, the results of comparing operation 410 and determining operation 412 are stored at the integrated circuit. A final determination of the validity of the results of computing operation 406 may be stored. Partial test results reflecting processing of the results but not reflecting a final determination of validity may also be stored. Finally, the raw outputs of one or more scan chains may be stored.

At optional reading operation 416, the testing apparatus reads from the integrated circuit the results of computing operation 406 for a single scan chain. The testing apparatus may use a multiplexer to facilitate the selection of a single scan chain. As discussed above, other embodiments of the present invention may involve reading a final determination of core functionality rather than individual scan chain results. It is further contemplated that operation 406 may be omitted or only non-duplicate results read from the integrated circuit.

At reading operation 418, the testing apparatus reads from the integrated circuit the determination of the validity of the results for each core made at determining operation 412.

At determining operation 420, the testing apparatus analyzes the data read from the integrated circuit to classify the integrated circuit to determine if all or a subset of the cores operate correctly. If the integrated circuit is classified as partially passing the operational tests, each individual core may be classified as passing or not passing. The testing apparatus may perform its own verification of the results of a single scan chain read at reading operation 416. This verification may comprise comparing the results read to an actual expected output. This result may be combined with the determination of functionality made at the integrated circuit and read at reading operation 418.

At configuring operation 422, the testing apparatus may configure the integrated circuit according to the test results. If the integrated circuit is classified as completely passing, no configuration may be required. In the case of a partially functional integrated circuit, the testing apparatus may configure the integrated circuit to disable those cores classified as not operating correctly. For integrated circuits classified as partially passing and not passing, configuration may comprise repairing the integrated circuit using the methods previously discussed.

The flowchart and block diagrams in the Figures illustrate the architecture, functionality, and operation of possible implementations of systems, methods and integrated circuits according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

That which is claimed is:

1. A method for testing an integrated circuit, the integrated circuit including multiple cores, each core being a processor core, each core including a plurality of registers configured to form at least one scan chain in each core, the method comprising:
coupling inputs of the scan chains together such that the inputs of the scan chains are electrically connected in a parallel circuit;
coupling outputs of the scan chains to a verification unit;
performing, at the integrated circuit, at least one computational operation on data provided to the integrated circuit via the scan chains;
providing a reference signal to the integrated circuit, the reference signal originating outside the integrated circuit and configured to indicate an expected output;
comparing, at the integrated circuit, the outputs of the scan chains against the reference signal;
comparing the outputs of the scan chains to each other to determine the validity of the outputs;
determining of the validity of the outputs of the scan chains at the verification unit, wherein a valid output indicates a functional core and an invalid output indicates a non-functional core;
indicating a malfunction of the integrated circuit if at least one of the outputs of the scan chains is determined not to be valid;
using the outputs of the scan chains to determine the functionality of one or more individual cores in the integrated circuit; and
recording, at the integrated circuit, an identity of one or more cores having outputs of the scan chains that are determined to be malfunctioning;
wherein the outputs of the scan chains are not used for verification when, for a specific set of outputs, a possibility exists that the outputs will differ from each other on a correctly functioning integrated circuit due to intentional differences between the cores of the integrated circuit.

2. A method for testing an integrated circuit, the integrated circuit including multiple cores, each core including a plurality of registers configured to form at least one scan chain in each core, the method comprising:
coupling inputs of the scan chains together such that the inputs of the scan chains are electrically connected in a parallel circuit;
coupling outputs of the scan chains to a verification unit;
determining of the validity of the outputs of the scan chains at the verification unit, wherein a valid output indicates a functional core and an invalid output indicates a non-functional core; and
indicating a malfunction of the integrated circuit if at least one of the outputs of the scan chains is determined not to be valid.

3. The method of claim 2, further comprising performing, at the integrated circuit, at least one computational operation on data provided to the integrated circuit via the scan chains.

4. The method of claim 2, further comprising:
providing a reference signal to the integrated circuit, the reference signal originating outside the integrated circuit and configured to indicate an expected output; and
comparing, at the integrated circuit, the outputs of the scan chains against the reference signal.

5. The method of claim 2, further comprising:
providing an expected hash value of an expected output, the hash value originating outside the integrated circuit;
computing, at the integrated circuit, a scan chain hash value, the scan chain hash value resulting from a hash function applied to the scan chain outputs; and
comparing, at the integrated circuit, the expected hash value against the scan chain hash value.

6. The method of claim 2, wherein the outputs of the scan chains are compared to each other to determine the validity of the outputs.

7. The method of claim 2, wherein the outputs of the scan chains are used to determine the functionality of one or more individual cores in the integrated circuit.

8. The method of claim 7, further comprising recording, at the integrated circuit, an identity of one or more cores having outputs of the scan chains that are determined to be malfunctioning.

9. The method of claim 7, further comprising substituting one or more replacement cores for one or more malfunctioning cores in the integrated circuit, the malfunctioning cores having outputs of the scan chains that are determined not to be valid.

10. The method of claim 2, wherein the outputs of the scan chains are not used for verification when, for a specific set of outputs, a possibility exists that the outputs will differ from each other on a correctly functioning integrated circuit due to intentional differences between the cores of the integrated circuit.

11. The method of claim 2, wherein each core is a processor core.

12. An integrated circuit comprising:
multiple cores, each core including a plurality of registers;
at least one scan chain for each core, the scan chains formed by coupling registers within the core, with the inputs of the scan chains electrically coupled in parallel circuit; and
a verification unit located in the integrated circuit and electrically coupled to outputs of the scan chains, the verification unit configured to determine the validity of the outputs of the scan chains and to indicate a malfunction of the integrated circuit if the outputs are determined not to be valid.

13. The integrated circuit of claim 12, wherein the integrated circuit is configured to perform at least one computational operation on data provided to the integrated circuit via the scan chains.

14. The integrated circuit of claim 12, further comprising:
a reference signal originating outside the integrated circuit and coupled to the integrated circuit, the reference signal configured to indicate an expected output; and
wherein the verification unit is configured to validate the outputs of the scan chains by comparing them to the reference signal.

15. The integrated circuit of claim 14, wherein the reference signal is provided to the integrated circuit in synchronization with the output of the scan chains.

16. The integrated circuit of claim 12, wherein the verification unit is configured to validate the outputs of the scan chains by comparing them to each other.

17. The integrated circuit of claim 12, wherein the verification unit is configured to use the outputs of the scan chains to determine the functionality of one or more individual cores in the integrated circuit.

18. The integrated circuit of claim 17, wherein the verification unit is configured to record, at the integrated circuit, an identity of one or more cores having outputs of the scan chains that are determined not to be valid.

19. The integrated circuit of claim 12, wherein the verification unit is configured to not use outputs of the scan chains for verification when, for a specific set of outputs, a possibility exists that the outputs will differ from each other on a correctly functioning integrated circuit due to intentional differences between the cores of the integrated circuit.

20. The integrated circuit of claim 12, wherein each core is a processor core.

* * * * *